United States Patent
Itoh et al.

(10) Patent No.: US 8,063,488 B2
(45) Date of Patent: Nov. 22, 2011

(54) SEMICONDUCTOR DEVICE AND MANUFACTURING METHOD THEREOF

(75) Inventors: Yoshio Itoh, Tokyo (JP); Yoshimasa Kushima, Yamanashi (JP); Hirokazu Uchida, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 10 days.

(21) Appl. No.: 12/382,992

(22) Filed: Mar. 27, 2009

(65) Prior Publication Data

US 2009/0243094 A1 Oct. 1, 2009

(30) Foreign Application Priority Data

Mar. 31, 2008 (JP) .................................. 2008-093238

(51) Int. Cl.
*H01L 23/498* (2006.01)
*H01L 23/28* (2006.01)

(52) U.S. Cl. ........ 257/737; 257/618; 257/619; 257/753; 257/787; 257/E23.068; 257/E23.116; 438/113; 438/114; 438/460

(58) Field of Classification Search .................. 257/753, 257/E23.068, E23.116, 618, 619, 737, 787; 438/113, 114, 460
See application file for complete search history.

(56) References Cited

U.S. PATENT DOCUMENTS

| | | | |
|---|---|---|---|
| 6,281,591 B1 | 8/2001 | Nakamura | |
| 6,881,611 B1 | 4/2005 | Fukasawa et al. | |
| 2002/0000658 A1* | 1/2002 | Kuwabara et al. | 257/737 |
| 2005/0032334 A1* | 2/2005 | Shibata | 438/462 |
| 2006/0154447 A1* | 7/2006 | Kushima et al. | 438/460 |
| 2006/0237850 A1* | 10/2006 | Yuan et al. | 257/774 |
| 2006/0244149 A1* | 11/2006 | Nakamura et al. | 257/773 |

FOREIGN PATENT DOCUMENTS

| | | | |
|---|---|---|---|
| JP | 10-79362 | | 3/1998 |
| JP | 2000-260910 A | | 9/2000 |
| JP | 2000243754 A | * | 9/2000 |
| JP | 2006-100535 | | 4/2006 |

* cited by examiner

*Primary Examiner* — Eugene Lee
*Assistant Examiner* — Peniel M Gumedzoe
(74) *Attorney, Agent, or Firm* — Rabin & Berdo, PC

(57) ABSTRACT

The semiconductor device comprises a first area and a second area positioned adjacent to the outside of the first area, the semiconductor substrate having a main surface and side surfaces and disposed in such a manner that the main surface is positioned in the first area and each of the side surfaces is positioned at a boundary between the first area and the second area, a plurality of pads formed over the main surface of the semiconductor substrate and a plurality of external connecting terminals formed thereon, which are respectively electrically connected to the pads, a first resin portion which is formed over the main surface of the semiconductor substrate so as to cover the pads and has a main surface and side surfaces, and which is formed in such a manner that the external connecting terminals are exposed from the main surface and each of the side surfaces is positioned at the boundary, and a second resin portion which is positioned in the second area and formed so as to cover the side surfaces of the semiconductor substrate and the side surfaces of the first resin portion and which is different in composition from the first resin portion.

6 Claims, 5 Drawing Sheets

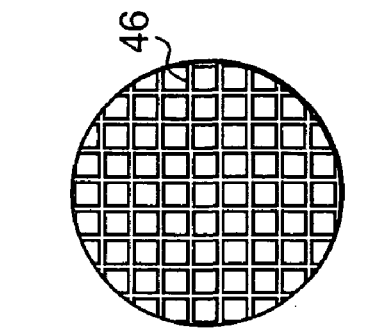
FIG. 4A
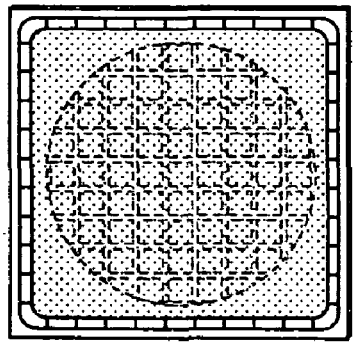
FIG. 4C
FIG. 4E
FIG. 4G
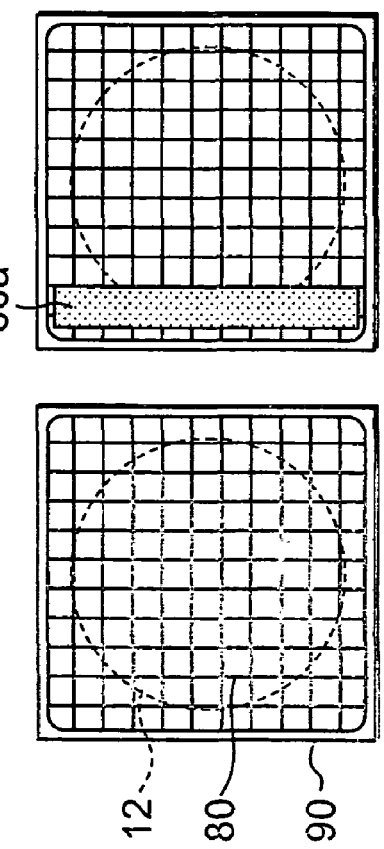
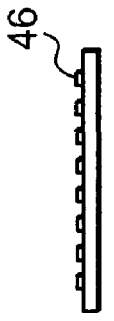
FIG. 4B
FIG. 4D
FIG. 4F
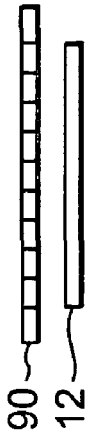
FIG. 4H

US 8,063,488 B2

SEMICONDUCTOR DEVICE AND MANUFACTURING METHOD THEREOF

BACKGROUND OF THE INVENTION

The present invention relates to a semiconductor device and a manufacturing method thereof. The present invention relates particularly to a small-sized semiconductor device corresponding to a wafer level chip size package (W-CSP) and a manufacturing method thereof.

There has been an increasing demand for miniaturization and thinning of a semiconductor device with semiconductor elements being packaged therein. There has been proposed a CSP (Chip Scale Package) wherein spherical terminals are disposed on the surface sides of semiconductor elements in lattice form in the field of a demand for its thinning in particular. There has also been proposed a wafer level chip size package (W-CSP) built into a CSP in a wafer state.

The W-CSP is one in which individual semiconductor devices formed on a wafer are fractionized and divided by a dicing saw or the like. However, cut surfaces are exposed at the side surfaces of the fractionized semiconductor devices, and fine cracks and chipping occur.

Therefore, in order to prevent the occurrence of such chipping and cracks, there has been proposed a semiconductor device molded with a resin after grooves or trenches relatively wide in width are formed in areas to be diced (refer to, for example, patent documents 1 (Japanese Unexamined Patent Publication No. Hei 10(1998)-79362), 2 (Japanese Unexamined Patent Publication No. 2000-260910) and 3 (Japanese Unexamined Patent Publication No. 2006-100535)).

Since, however, all of the above-described semiconductor devices on the semiconductor wafer including the trenches at any thereof are molded with the same resin, a resin must be selected which combines both adhesion to the semiconductor wafer and an electrical insulating property. That is, the resin charged into the trenches must be firmly adhered to the semiconductor substrate even after dicing. On the other hand, there is a need to select a resin having insulation enough to suppress leak current. Thus, the selection of a resin most appropriate to respective spots has been required.

Such a semiconductor device and its manufacturing method will be explained specifically.

FIG. 5(A) is a sectional view of a semiconductor wafer prior to execution of mold formation. As shown in FIG. 5(B), trenches 132 are respectively formed in dicing areas of a semiconductor wafer 131. The trenches 132 are formed in all the dicing areas of the surface of the wafer. Next, as shown in FIG. 5(C), the trenches 132 are filled with a mold resin 133. As a matter of course, the mold resin layer 133 is formed even within the trenches 132. Thereafter, as shown in FIG. 5(D), the mold resin layer 133 is polished or ground to form a mold resin layer 134 having a desired thickness. Finally, as shown in FIG. 5(E), full cut portions 135 are respectively formed in the trenches 132 with widths each narrower than the width of each trench 132. With the formation of the full cut portions 135, the mold resin layers 134 lying within the trenches 132 are also separated from one another and left behind as grip portions.

Thus, the conventional semiconductor device involves the above-described problem because the compositions of the grip portions and other portions are comprised of the same resin portion.

The following problems arise in the method for manufacturing the semiconductor device having the above-described grip structure. In order to make adaptation to an actual manufacturing process, there was a need to take some measures thereagainst.

Since the trenches 132 are first formed and the mold resin layer 133 is formed in the conventional manufacturing method, cracks of the semiconductor wafer 131 occur with the trenches 132 as points of origin due to a pressure-applying process or the like necessary to charge the mold resin. There was a possibility that since the semiconductor element areas were exposed before the formation of the mold resin layer 133, chips and particles produced by processing of the trenches 132 would be adhered to the semiconductor element areas, thereby causing a quality problem. Further, since a state under the mold resin layer 133 cannot be confirmed where the mold resin layer 133 is formed, there is a need to provide steps for performing an inspection and measurements necessary before the formation of the mold resin layer 133. Upon this inspection, the confirmation of finished quality of each trench 132 and clean-up prior to mold processing are required again. The risk of wafer breakage with a conveying process and wafer handling becomes high. In addition, processing environments prior and subsequent to mold resin processing normally differ and processing under the environment high in cleanliness is essential before the mold resin processing. On the other hand, dicing processing executed after the mold resin processing is not normally executed under the environment high in cleanliness. Therefore, there is a need to perform the respective processes under environments and devices different in cleanliness. A problem has been presented even in terms of the maintenance and control of cleanliness.

SUMMARY OF THE INVENTION

The present invention has been made in terms of the above problems and aims to achieve the following objects.

Namely, an object of the present invention is to provide a semiconductor device in which the scope of selection of a resin is wide and adhesion between a substrate and the resin is excellent.

Another object of the present invention is to provide a method for manufacturing a semiconductor device, which is capable of preventing cracks of a semiconductor wafer at resin molding.

As a result of extensive investigations, the present inventors have found that the above problems can be solved by using the following semiconductor device manufacturing method, thereby leading to the achievement of the above objects.

Namely, there is provided a semiconductor device according to the present invention, comprising a first area and a second area positioned adjacent to the outside of the first area, a semiconductor substrate having a main surface and side surfaces and disposed in such a manner that the main surface is positioned in the first area and each of the side surfaces is positioned at a boundary between the first area and the second area, a plurality of pads formed over the main surface of the semiconductor substrate and a plurality of external connecting terminals formed thereon, which are respectively electrically connected to the pads, a first resin portion formed over the main surface of the semiconductor substrate so as to cover the pads and having a main surface and side surfaces, the first resin portion being formed in such a manner that the external connecting terminals are exposed from the main surface and each of the side surfaces is positioned at the boundary, and a second resin portion positioned in the second area and formed so as to cover the side surfaces of the semiconductor substrate and the side surfaces of the first resin portion, the second resin portion being different in composition from the first resin portion.

Further, there is provided a method for manufacturing a semiconductor device formed by fractionization and division after a plurality of semiconductor element are formed over a semiconductor substrate, comprising the steps of forming a first resist portion over the semiconductor substrate prior to its fractionization, forming trenches in areas for dicing the semiconductor substrate, forming a second resin portion different in composition from the first resin portion in each of the trenches, and dicing the semiconductor substrate with respect to the second resin portion with widths each narrower than the trench thereby to bring the semiconductor device into fractionization and division.

According to the present invention, there can be provided a semiconductor device in which the scope of selection of a resin is wide and adhesion between a substrate and the resin is excellent.

According to the present invention as well, there can be provided a method for manufacturing a semiconductor device, which is capable of preventing cracks of a semiconductor wafer at resin molding.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 4(A), 4(C), 4(E) and 4(G) are respective process top views for charging a resin by a printing system of the method for manufacturing the semiconductor device according to the embodiment of the present invention, and FIGS. 4(B), 4(D), 4(F) and 4(H) are respectively process sectional views for charging the resin by the printing system of the method for manufacturing the semiconductor device according to the embodiment of the present invention.

DETAILED DESCRIPTION OF THE PREFERRED EMBODIMENTS

Preferred embodiments of the present invention will hereinafter be described with reference to the accompanying drawings. Incidentally, the shape, size and physical relationship of each constituent part or element in the accompanying drawings are merely approximate illustrations to enable an understanding of the present invention. The present invention is not limited by it in particular.

A semiconductor device of the present invention and a manufacturing method thereof will hereinafter be explained in detail.

<Semiconductor Device>

Figure 1A:
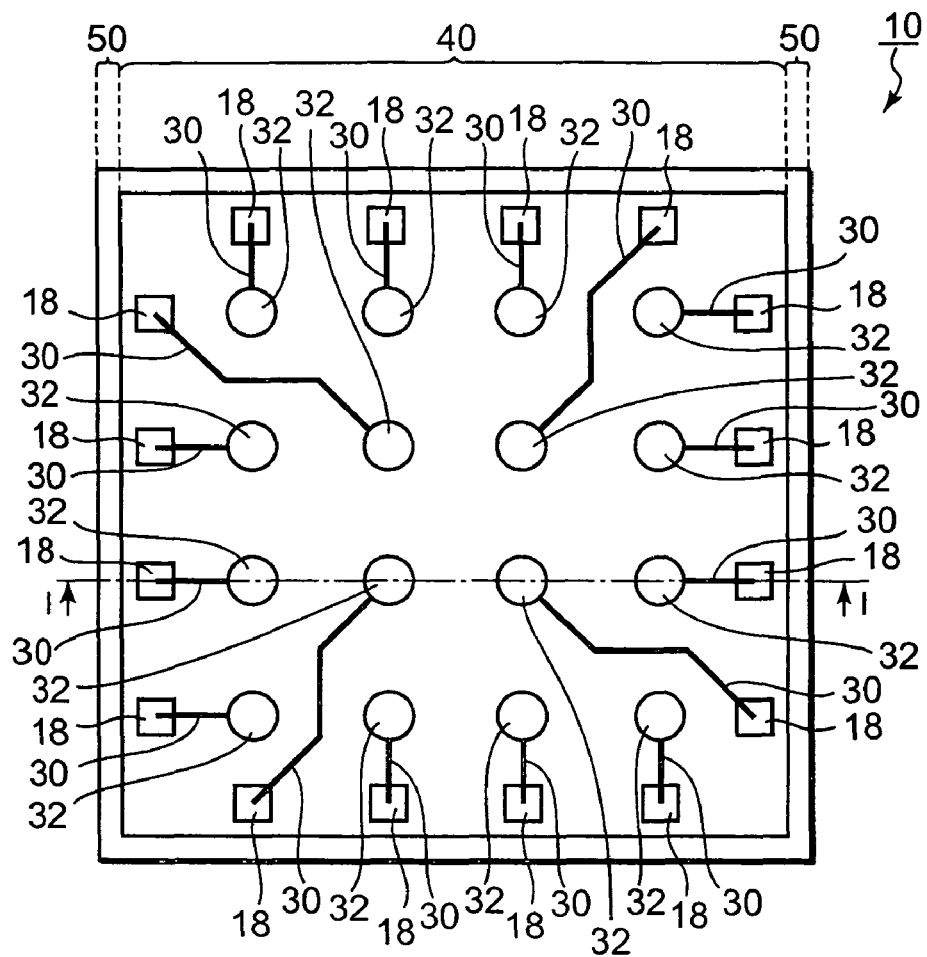
FIG. 1(A) is a top view of a semiconductor device according to an embodiment of the present invention and FIG. 1(B) is a sectional view of the semiconductor device shown in FIG. 1(A)
Figure 1B:
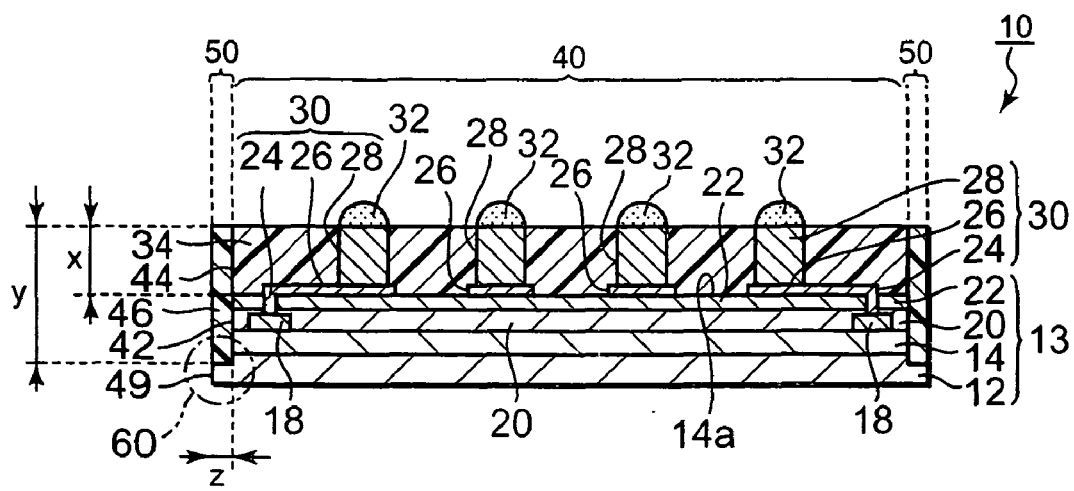

FIG. 1(A) is a transparent plan view for describing the physical relationship of each constituent element as viewed from above a semiconductor device 10. To make it easy to describe each formed wiring structure, a sealing portion formed on the upper surface side thereof is practically shown so as to be transparent. FIG. 1(B) is a typical sectional view showing an area cut along a one-dot chain line indicated by I-I of FIG. 1(A).

The semiconductor device 10 has a WCSP structure. Areas for configuring circuit elements, i.e., required circuit elements are formed in a semiconductor substrate 12 by a wafer process. Incidentally, a substrate area formed with the circuit element configuring areas is designated at 14 in FIGS. 1(A) and 1(B). In the following description, the substrate area is called simply "element area 14". The element area 14 is generally configured by a plurality of active elements each having an integrated circuit such as an LSI. In the following description, a structure including such an element area 14 formed on the semiconductor substrate 12 and comprising circuit element connecting pads 18 to be described later, a passivation film 20 formed on the element area 14 so as to expose parts of the circuit element connecting pads 18, and an insulating film 22 formed so as to expose parts of the circuit element connecting pads 18 is referred to as "semiconductor body 13". In the semiconductor body 13, the surface 14a of the insulating film 22 is configured as the surface of the semiconductor body 13.

The semiconductor body 13 has a main surface and side surfaces. The main surface is located in a first area 40 in FIG. 1(B). Each of the side surfaces represents a side surface 42 located at a boundary between the first area 40 and a second area 50 in FIG. 1(B).

In FIG. 1(B), wiring structures 30 are provided on the semiconductor body 13. Each of the wiring structures 30 may include an electrode post 28 (also called "protruded electrode") electrically connected to an external connecting terminal 32, and a redistribution wiring layer 24 for electrically connecting the electrode post 28 and the circuit element connecting pad 18. The wiring structure 30 may be a wiring structure unprovided with the redistribution wiring layer 24 and the electrode post 28, i.e., a structure in which the external connecting terminal 32 is placed on the circuit element connecting pad 18 through the insulating film 22 interposed therebetween. In this case, a first resin section or portion 34 (sealing portion) to be described later becomes such a thin film that each external connecting terminal 32 is exposed onto the insulating film 22. Even among these, the wiring structure preferably takes the structure including the redistribution wiring layer 24 and the electrode post 28. In this structure, some of the redistribution wiring layer 24 is configured as an electrode post pad 26, and the electrode post 28 is electrically connected to the electrode post pad 26. Thus, each external connecting terminal 32 is exposed from the first resin portion 34 formed in the first area 40 and hence the position of the external connecting terminal 32 can be suitably selected according to the heights of the redistribution wiring layer 24 and the electrode post 28. Therefore, the degree of freedom of design of the semiconductor device might be enhanced.

In the semiconductor device 10 of the present invention, the first resin portion 34 is provided in the first area 40 so as to seal the redistribution wiring layer 24, the electrode post pads 26 and the electrode posts 28. The first resin portion 34 is provided with a main surface and side surfaces. The external connecting terminals 32 are exposed from the main surface, and the side surface 44 is located at the boundary between the first area 40 and the second area 50 in a manner similar to the side surface 42 of the semiconductor body 13.

Further, a second resin section or portion 46 is located in the second area 50 and formed so as to cover the side surfaces 42 of the semiconductor body 13 and the side surfaces 44 of the first resin portion 34.

In FIG. 1(A), a multilayer wiring structure (not shown and hereinafter called also "internal wiring") is generally formed in the element area 14 and the plural active elements are formed so as to be capable of fulfilling their predetermined functions in cooperation with one another. The electrode pads 18, the passivation film (not shown in FIG. 1(A)) and the insulating film (not shown in FIG. 1(A)) are provided over the element area 14. According to the configuration shown in FIG. 1(A), the electrode pads 18 are provided along the outer peripheral-side area lying within the area of the semiconductor device 10 in such a manner that they become identical to one another in pitch defined therebetween.

The external connecting terminals 32 are disposed in the center side area of the semiconductor device 10, which is surrounded by the circuit element connecting pads 18.

The external connecting terminals 32 are provided so as to be identical in pitch defined therebetween. Further, the external connecting terminals 32 are electrically connected to their corresponding electrode pads 18 by the wiring structures 30 comprised of the redistribution wiring layer 24, the electrode post pads 26 and the electrode posts 28.

The semiconductor device 10 of the present invention is provided with the second area 50 at the outer peripheral portion of the first area 40. As described above, the first resin portion (not shown in FIG. 1(A)) is formed in the first area 40, and the second resin portion (not shown in FIG. 1(A)) is formed in the second area 50.

The first resin portion 34 and the second resin portion 46 are different in composition from each other. Particularly preferred is that the second resin portion 46 is excellent in adhesion to the semiconductor body 13 and the first resin portion 34. This will be described later.

In the semiconductor device of the present invention having such a configuration, the first resin portion is required to have insulation principally, and the second resin portion is required to have adhesion to the first resin portion and the semiconductor substrate. Therefore, a resin or filler can be selected in such a manner that that the right material is put in the right place. The second resin portion is formed so as to cover the side surfaces of the first resin portion and the side surfaces of the semiconductor body. Thus, the area at which the second resin portion and the semiconductor substrate contact each other increases, and the adhesion to the substrate by an anchor effect is excellent. Further, such a configuration that the sides of the semiconductor device are protected enables suppression of the direct influence of the external environment thereon. In addition, when the sides of the semiconductor device are held by a handling device, the semiconductor device can be prevented from being damaged by a handling device when the sides of the semiconductor device are held by the handling device.

In the present invention, the neighborhood of the portion where the first resin portion 34, the second resin portion 46 and the semiconductor body 13 are joined to one another might be called "grip portion 60".

As a preferred mode for the semiconductor device of the present invention, it is preferred that as shown in FIG. 1(B), the semiconductor substrate 12 has a first side surface and a second side surface 49, and that the first side surface constitutes part of the side surface 42 of the semiconductor body 13 and the second side surface 49 is positioned at the outer end of the second area 50. In the case of such a structure, both of the first area 40 and the second area 50 are formed on the semiconductor substrate 12. Further, in the case of such a structure, the thickness y of the second resin portion 46 is smaller than the sum of the thickness x of the first resin portion 34 and the thickness of the semiconductor body 13 and larger than the thickness x of the first resin portion 34 in FIG. 1(B).

Since the area at which the second resin portion 46 and the semiconductor substrate 12 contact each other increases, the semiconductor device comprised of such a structure makes it possible to enhance the adhesion between the semiconductor substrate 12, the first resist portion 34 and the second resin portion 46 by the anchor effect and suppress peeling off of the semiconductor substrate 12 from the first resin portion 34. Fractionization is enabled by one dicing in a final process step subsequent to the formation of the external connecting terminals 32.

The first resin portion, the second resin portion and the grip portion will hereinafter be explained in detail.

[First Resin Portion and Second Resin Portion]

Each of the first resin portion 34 and the second resin portion 46 employed in the present invention includes a filler contained in a resin. With the containing of the filler therein, the flowability of the resin is adjusted and the flame resistance of the resin-portion is also enhanced. The second resin portion 46 is different in composition from the first resin portion. It is shown that when each of the first and second resin portions 34 and 46 is comprised of the resin and filter, any of forms different in resin and identical in filler, forms identical in resin and different in filler, and forms different in resin and filler is contained as the different compositions.

[Resin]

As the resin employed in the first resin portion 34, there may be mentioned, for example, an epoxy resin, a polyimide resin, polybenzoxazole resin (PBO), a novolac resin, a phenol resin, an acrylic resin, an urethane resin, a silicone resin, PPS (Poly Phenylene Sulfide), polyethylene telephthalate (PET), polyethylene (PE), or a mixed resin (WPR) or the like comprised principally of the novolac resin and the phenol resin. Since it is necessary to insulate between redistribution wirings, the resin needs to have insulation.

The semiconductor device of the present invention preferably has heat resistance of such an extent that it can withstand a reflow process because it passes through the reflow process upon formation of each terminal. That is, the resin is preferably such a resin that a glass transition temperature (Tg) becomes higher than a reflow temperature. Described specifically, as such a resin, there may be mentioned, even among the above-described resins, the epoxy resin, the polyimide resin, the polybenzoxazole resin (PBO), the mixed resin (WPR) comprised principally of the novolac resin and the phenol resin, or the like. Incidentally, the mixing ratio (mass ratio) between the novolac resin and the phenol resin in WPR preferably ranges from 1:30 to 1:20.

The resin employed in the second resin portion 46 must take into consideration even the adhesion between the semiconductor body 13 and the first resin portion 34 and the prevention of chipping or the like at the dicing in addition to the adhesion, insulation and Tg or the like to the semiconductor body 13. When the semiconductor device is divided into individuals, it is liable to be diced as its hardness becomes close to the semiconductor substrate, and the occurrence of cracks or the like can be suppressed. That is, as the resin used in the second resin portion 46, there may be mentioned the epoxy resin, polyimide resin, polybenzoxazole resin (PBO)

or the mixed resin (WPR) comprised principally of the novolac resin and the phenol resin. Incidentally, the resin is preferably the same resin as that employed in the first resin portion 34 if the adhesion to the first resin portion 34 is taken into consideration.

The second resin portion 46 employed in the present invention needs to be provided with a trench or groove narrow in width, enhance a filling property by a reduction in the viscosity of the resin and suppress the occurrence of voids. Therefore, it is preferred that in order to adjust the viscosity of the resin, a solvent such as ethyl lactate or N-methylpyrrolid or the like is suitable contained therein. It is preferable that the content of the resin ranges from greater than or equal to 10 mass % to less than or equal to 60 mass % with respect to the mass of the pre-curing resin.

[Filler]

A filler may preferably be contained in the first resin portion 34 and the second resin portion 46 employed in the present invention. As the filler employed in the present invention, it may preferably be an insulative filler because there is a need to insulate between redistribution wirings. As the filler, there may be mentioned, for example, alumina, silica, silicone rubber, BN or diamond or the like. Although the shape of each particle makes use of a normal sphere-shaped one, the particle may use a granular one, a shredded one, a phosphorus-flake shaped one, a dendritic one and the like. Even among these, a particle whose average circularity measured by a flow particle image measuring device ranges from 0.975 or more to 1.000 or less, is preferred. Since the particle shape is approximately spherical or spherical when the average circularity ranges within this range, the flowability of the filler is good and its filling property is also enhanced. It is thus possible to reduce the rate of occurrence of voids in the second resin portion 46 and suppress chipping or the like at the dicing time. The corresponding circularity is of an index indicative of the degree of depressions and projections of the filler. When the filler is of a complete sphere, the circularity indicates 1.000. As the surface shape becomes more complex, the circularity becomes a small value.

The average circularity is measured using the flow particle image measuring device [FPIA-2100 TYPE] (manufactured by Sysmex Corporation) and calculated using the following equation:

Equivalent circle diameter=(particle projection area/$\pi$)$^{1/2}$×2

Circularity=circumferential length of circle having the same area as particle projection area/circumferential length of particle projection image (1)

where the "particle projection area" indicates the area of a binarized filler particle image, and the "circumferential length of particle projection image" is defined as the length of a profile or border line obtained by connecting edge points of the filler particle image. The measurement is done using the circumferential length of a particle image at image processing in an image processing resolution of 512×512 (pixel of 0.3 μm×0.3 μm).

Assuming that the circularity (center value) at a cutoff point i of a particle size distribution is ci and the number of measured particles is m, average circularity C that means an average value of a circularity frequency distribution is calculated from the following equation:

$$\text{Average circularity } C = \sum_{i=1}^{m} ci/m \quad (2)$$

Incidentally, the measuring device [FPIA-2100] employed in the present invention calculates the circularities of respective particles and thereafter divides the particles into classes at which a circularity of 0.4 to 1.0 is equally divided every 0.01, according to the obtained circularities upon calculation of the average circularity and circularity standard deviation. Then, the measuring device calculates the average circularity and circularity standard deviation using the center value between their cutoff points and the number of the measured particles.

As a specific measuring method, an ion exchange water of 10 ml from which impure solid materials or the like have been removed is prepared in a container in advance. A surface-active agent, preferably alkylbenzene sulfonate is added into the container as a dispersing agent. Further, a sample to be measured of 0.02 g is added thereto, followed by execution of its uniform dispersion. Using an ultrasonic dispersing machine [Tetora 150 type](manufactured by Nikkaki-bios Co., Ltd.) as dispersing means thereof, dispersion processing is done for two minutes to provide a dispersion solution for measurement. At this time, the dispersion solution is suitably cooled in such a manner that the temperature of the dispersion solution does not reach 40° C. or higher. In order to suppress variations in the circularity, the installation environment of the flow particle image analyzing device FPIA-2100 is controlled to 23° C.±0.5° C. in such manner that the in-device temperature thereof becomes 26° C. to 27° C. An autofocusing adjustment is done using 2-μm latex particles at 1-hour intervals, preferably 2 hours intervals.

Upon the measurement of the filler's circularity, the flow particle image measuring device is used to readjust the concentration of the dispersing solution in such a manner that a filler particle concentration at its measurement ranges from 3000 to 10000 pieces/μl and thereby to measure filler particles of 1000 or more. After the measurement thereof, the filler particles are respectively divided into an equivalent circle diameter of greater than or equal to 0.6 μm to less than 3 μm, an equivalent circle diameter of greater than or equal to 3 μm to less than 6 μm and an equivalent circle of greater than or equal to 6 μm to less than 400 μm using data about the measured filler particles. Then, the average circularity of the filler particles in the ranges of the respective equivalent circle diameters is determined.

On the other hand, although there is a need to adjust the viscosity of the resin in order to provide the second resin portion 46, the viscosity can be adjusted by the average particle diameter of each of fillers or the content thereof in addition to its adjustment by the type of resin, the solvent and the circularity of each filler.

Preferably, the fillers are contained in the second resin portion 46 and the filler's average particle diameter in the present invention ranges from 0.2 μm or more to 40 μm or less. When the average particle diameter lies within this range, the viscosity of the resin for forming the second resin portion is reduced because the filler contained in the second resin portion is small, and the filling property of the resin is enhanced, whereby there is a case in which the resin can be charged without producing voids even if the width of each groove is narrow. Here, the average particle diameter represents the average value of the equivalent circle diameters of the respective particles. The equivalent circle diameters correspond to the equivalent circle diameters measured by the flow particle image measuring device and are obtained by the above equation.

In the present invention, the equivalent circle diameter preferably ranges from 0.2 μm or more to 40 μm or less. When it lies within this range, the flowability of the resin is satisfactory and the resin can be charged without producing voids even if each groove to be described later for forming the second resin portion is narrow. There is a case where when the equivalent circle diameter is under and not greater than 0.2 μm, the fillers are flocculated together in the resin so that the second resin portion in which the fillers are dispersed uniformly cannot be formed. There is also a case in which the fillers in the vicinity of the side surfaces of the semiconductor device are particle-shedded at dicing and hence the flatness of the surface thereof is damaged. On the other hand, there is a case in which when the equivalent circle diameter is larger than 40 m, the fillers cannot be penetrated into the grooves to be described later, and hence the filling property is deteriorated.

The content of the filler in the present invention preferably ranges from 40 mass % or more to 90 mass % or less with respect to the second resin portion 46. This mass ratio indicates the ratio of the mass of the resin to the mass of the second resin portion 46 after a resin layer has been formed and the resin has been cured. There is a case in which when the content is not greater than 40 mass %, the viscosity of the pre-print resin is excessively low so that the resin expands to terminal mounting spots of columnar electrodes. The problem of heat resistance or the like also arises because the amount of filler is small. On the other hand, there is a case in which when the content is greater than or equal to 90 mass %, the viscosity of the pre-print resin is excessively high so that its filling property is deteriorated.

As a preferred mode of the second resin portion 46 in the present invention, there is cited that the resin is an epoxy resin, a polyimide resin, a polybenzoxazole resin (PBO resin) or a mixed resin (WPR resin) comprised principally of a novolac resin and a phenol resin, the filler is alumina or silica, the equivalent circle diameter ranges from 0.2 μm or more to 40 μm or less, the average particle diameter of each of fillers ranges from 0.2 μm or more to 40 μm or less, and the content of filler ranges from 40 mass % or more to 90 mass % or less. Incidentally, the type of resin can be suitably selected in consideration of the adhesion between the first resin portion 34 and the semiconductor substrate 12.

The first resin portion 34 indicates a form similar to the normal mold resin and makes use of an epoxy resin, for example. The average particle diameter of the filler ranges from 50 μm or more to 60 μm or less. The content of filler ranges from about 70 mass % or more to 80 mass % or less with respect to the first resin portion. This mass ratio corresponds to the ratio of the mass thereof to the total mass of the first resin portion after the resin has been cured.

Thus, the average particle diameter of the filler contained in the second resin portion 46 is preferably smaller than the average particle diameter of the filler contained in the first resin portion 34. The content of each filler contained in the second resin portion 46 is preferably lower than the content of each filler contained in the first resin portion 34. Namely, it is shown that when the content of the first filer is 80 mass % with respect to the total mass of the first resin portion 34, the content of the second filler is less than 80 mass % with respect to the total mass of the second resin portion 46. With the setting of this range, the anchor effect of the second resin portion 46 can be more achieved.

As shown in FIG. 1(B), the thickness x of the first resin portion 34 corresponds to the height from the surface of the semiconductor body 13, i.e., the surface of the insulating film 22 to the surface of each electrode post 28 and ranges from about 30 μm to 120 μm, for example.

The thickness y of the second resin portion 46 corresponds to the height from the bottom face of the grip portion to be described later to the surface of each electrode post 28. The width z thereof corresponds to the width of the grip 60. The details thereof will be explained later.

[Grip Portion]

The semiconductor device according to the present invention preferably has the grip portion 60 at the side portion as viewed in the sectional shape of the semiconductor substrate as shown in FIG. 1.

The grip portion 60 corresponds to a spot at which the second resin portion 46 is provided. Since the area at which the second resin portion 46 and the semiconductor body 13 contact increases as compared with the case free of the provision of the grip portion 60, the peeling off of these can be suppressed. Even if voids have occurred between the bottom of the first resin portion 34 and the semiconductor body 13 in FIG. 1(B), moisture or the like does not reach the redistribution wiring layer 24 because the sidewall 44 of the first resin portion 34 and the sidewall 42 of the semiconductor body 13 are adhered to the second resin portion 46 by an anchor effect.

The height of the grip portion 60 in the present invention, i.e., the thickness y of the second resin portion 46 preferably ranges from 50 μm or more to 200 μm or less. Since the anchor effect is more enhanced when it lies within this range, the second resin portion 46 and the semiconductor substrate 12, and the second resin portion 46 and the semiconductor body 13 become hard to peel off. Further, environmental resistance is also excellent because they are hard to peel off.

The width z of the grip portion in the present invention preferably ranges from 5 μm or more to 30 μm or less. With the grip portion being provided with the width of 5 μm or more, the moisture or the like does not reach the redistribution wiring portion because it has a sufficient width even if the moisture or the like enters the surface of the second resin portion. When the width is 30 μm or less, the size of the semiconductor device itself is not excessively large and adaptation to a demand for its size reduction can be achieved.

<Manufacturing Method of Semiconductor Device>

The semiconductor device manufacturing method of the present invention is a method for manufacturing a semiconductor device formed by fractionizing and division after a plurality of semiconductor elements are formed on a semiconductor substrate, which comprises the steps of forming a first resin portion on the semiconductor substrate prior to fractionization thereof, forming grooves or trenches in regions for dicing the semiconductor substrate, forming a second resin portion in each of the trenches, and dicing the semiconductor substrate with respect to the second resin portion with widths each narrower than the trench thereby to bring the semiconductor device into fractionization and division.

Since the trenches are formed after the formation of the molded first resin portion where these process steps are provided, it is possible to suppress a reduction in the strength of the substrate even after the trench formation and suppress cracks of the semiconductor substrate with the trenches as points of origin. Since the redistribution wirings and columnar substrate have already been covered with the first resin portion upon trench formation, chips or particles generated or produced upon the formation of the trenches are not adhered thereto. There is no need to perform a cleaning process for eliminating the chips and particles. It is also unnecessary to consider a cleaning device, cleaning environment and the like.

With a manufacturing method of a semiconductor device 100 of the present invention as one example, respective process steps thereof will hereinafter be described in detail along FIGS. 2 and 3.

[Step for Forming First Resin Portion on the Semiconductor Substrate Prior to its Fractionization]

Figure 2A:
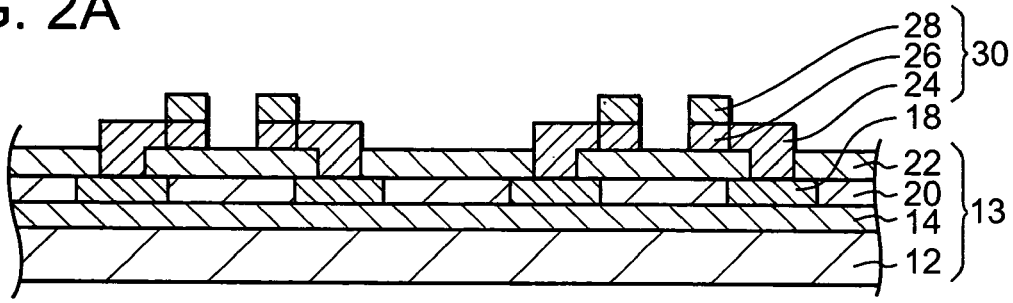
FIGS. 2A-2D are process sectional views of a method for manufacturing a semiconductor device according to an embodiment of the present invention.

In the present invention, a semiconductor body 13 is formed as shown in FIG. 2(A). An element area 14 and circuit element connecting pads 18 are first sequentially formed on a semiconductor substrate 12. A passivation film 20 is formed on the element area 14 in such a manner that the circuit element connecting pads 18 are exposed. Then, an insulating film 22 is formed on the passivation film 20 in such a manner that the circuit element connecting pads 18 are exposed.

Next, wiring structures 30 are formed. A redistribution wiring layer 24 is first drawn or led out from each of the circuit element connecting pads 18. Then, electrode posts 28 electrically connected to external connecting terminals are provided according to a plating step. Incidentally, some of the redistribution wiring layer 24 are formed as electrode post pads 26. The electrode posts 28 are electrically connected to their corresponding electrode post pads 26.

Figure 2B:
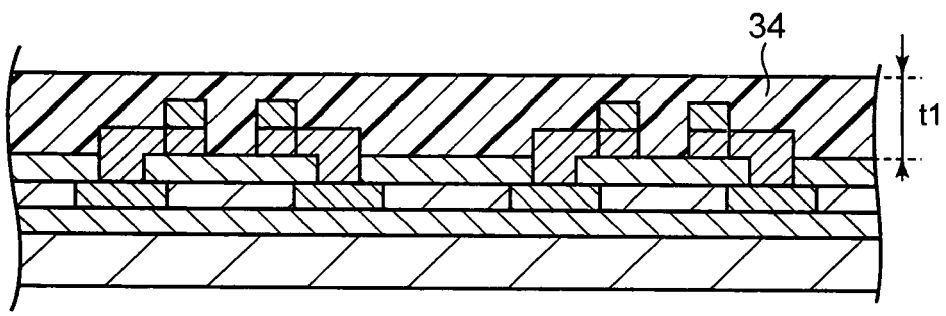

Thereafter, as shown in FIG. 2(B), a first resin portion 34 is formed on the semiconductor substrate 12 by the known technique such as the spin coat method so as to cover the redistribution wiring layer 24 and the electrode posts 28. The first resin portion 34 has such a thickness t1 that the electrode posts 28 are covered, and is provided such that t1 becomes 120 μm or so, for example. The first resin portion 34 has the resin described above and fillers contained in the resin.

[Step for Forming Trenches or Grooves in Dicing Areas of Semiconductor Substrate]

Figure 2C:
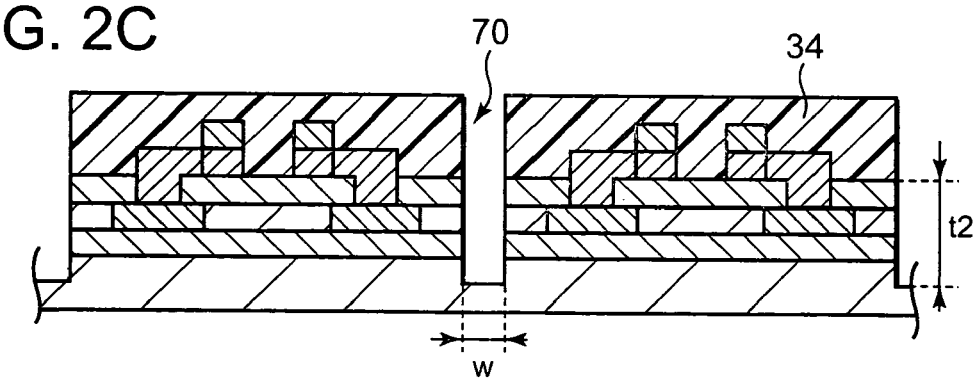

As shown in FIG. 2(C), trenches 70 are provided in such a manner that a predetermined depth t2 is formed in the surface of the semiconductor substrate 12 by a blade (not shown) that rotates at high speed. Since the first resin portion 34 has been formed in the present invention, adverse effects exerted on the redistribution wiring layer 24 and the electrode posts 28 by re-adhesion of chips or the like to the semiconductor element area can be reduced even though dicing is done in the corresponding process step.

The trenches 70 are formed at their corresponding portions each formed as a peripheral portion of each semiconductor element. The depth (t1+t2) of each of the trenches 70 preferably ranges from 50 μm or more to 200 μm or less. If the depth is 50 μm or more, then stress applied to the semiconductor substrate upon dicing at the fractionization of the semiconductor device can be reduced. It is possible to form a stable width without depending on the shape of the blade. On the other hand, if the depth is 20 μm or less, then the semiconductor substrate located at the bottom face of each trench 70 is not excessively thin. Assuming that the depth of the trench 70 is 180 μm or so, for example, t1 shown in FIG. 2(B) becomes 120 μm and t2 shown in FIG. 2(C) becomes 60 μm.

The width w of the trench 70 preferably ranges from 40 μm or more to 180 μm or less. The width w thereof needs to be at least larger than the thickness of the blade used upon fractionization and division to be described later. If the width of the trench 70 is narrower that the blade thickness, then no grip portion 60 is formed, and the semiconductor substrate 12 and the first resin portion 34 are directly diced. Namely, when the semiconductor substrate of such a configuration as not to have the conventional grip portion is diced, it leads to cracks produced in the semiconductor substrate and the first resin portion. Assuming that the blade thickness used upon formation of each trench 70 in the semiconductor substrate ranges from 5 μm or more to 150 μm or less upon formation of the width of each trench 70, the width is formed larger by 1 to 5 μm than its range. Thus, a blade having a thickness made thin by about 1 to 5 μm is preferably used to obtain a desired width.

[Step for Forming Each Second Resin Portion in the Trench]

Figure 2D:
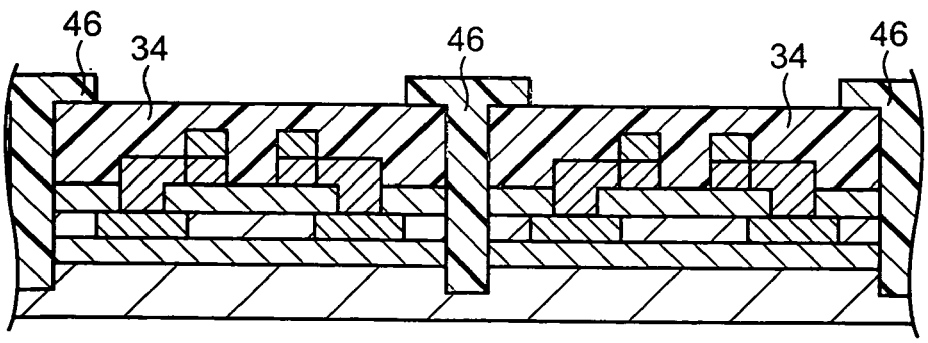

A second resin portion 46 is formed so as to bury each trench 70 as shown in FIG. 2(D).

A method for forming each second resin portion 46 is preferably a printing method or system and a dispense method or system.

The printing method is as follow: As shown in FIG. 4(A), for example, a semiconductor substrate 12 formed with trenches 70 is disposed below a mask 90. As shown in FIG. 4(C), a resin 50a containing the above fillers is placed on the mask 90. Next, as shown in FIG. 4(E), a resin is extended with a printing brush (not shown) and a second resin portion 46 extruded out of the mask 90 is formed so as to bury each trench 70 of the semiconductor substrate 12. At this time, the printing brush (not shown) is preferably moved forward and backward alternately two or three times such that the resin 50a is changed into each trench 70 uniformly. Further, it is particularly preferred that when the printing brush (not shown) is moved from side to side alone, the resin is uniformly charged by the printing brush (not shown) after the semiconductor substrate 12 or the mask 90 is rotated 90°, to uniformly charge the resin even into each trench lying in the direction orthogonal to the movement of the printing brush (not shown). It is also particularly preferred that the printing brush is moved in the vertical direction. Such a method makes it possible to form the second resin portion 46 on the semiconductor substrate 12 easily.

Thus, in the present invention, while the mask 90 is pressurized upon extrusion of the resin, the semiconductor substrate 12 is also pressurized because the distance between the mask 90 and the semiconductor substrate 12 is very narrow. Since, however, the present method is different from the conventional manufacturing method in the present invention and the first resin portion 34 has been formed upon charging of the resin 50a, the strength of the semiconductor substrate 12 is reinforced by the formation of the trenches 70. Thus, even though the pressure is applied more or less, cracks of the semiconductor substrate 12 with the trenches 70 as points of origin can be prevented.

The dispense method is of a method for injecting a resin into a slender pen-shaped dispenser and injecting the resin at the inside of each trench 70 from the leading end or tip of the dispenser. Since the semiconductor substrate 12 is not pressurized upon resin injection in the present method, the cracks with the trenches 70 as the points of origin are further suppressed. Namely, since each of the trenches 70 can be made deeper when the resin is charged by the dispenser method, the second resin portion 26 is thickened. As a result, the pressure and shock applied to the semiconductor substrate 12 when semiconductor elements are brought into fractionization and division by dicing can be reduced. Further, since the anchor effect by each second resin portion is more enhanced as described above, the second resin portion 46 and the semiconductor substrate 12 become hard to peel off.

Figure 3E:
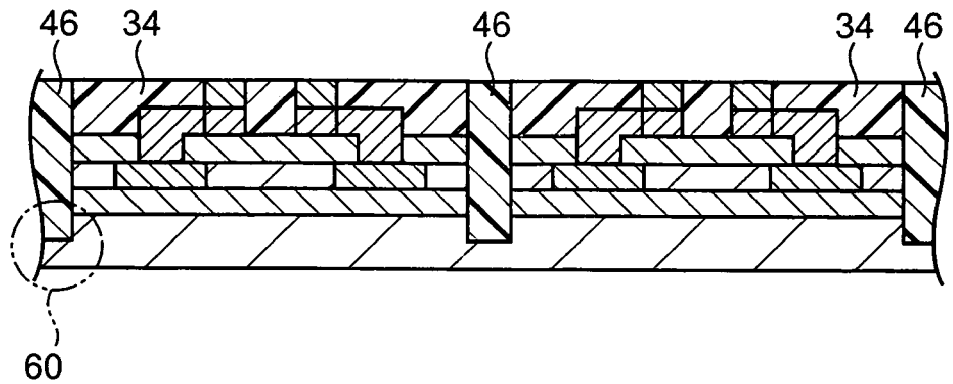
FIGS. 3E-3G are process sectional views of the semiconductor device manufacturing method shown in FIG. 2.
Figure 3F:
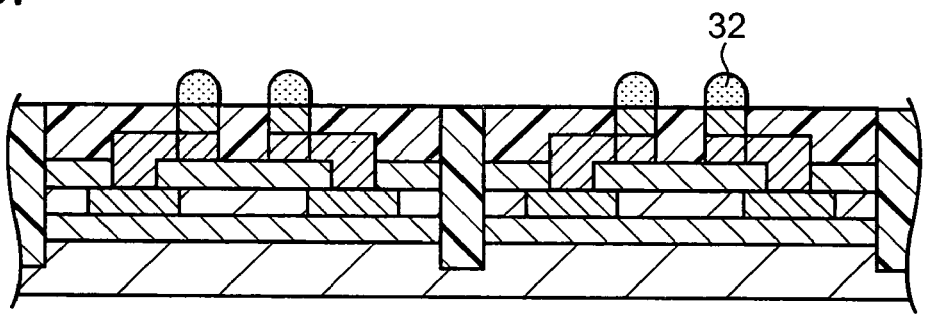

After the formation of each second resin portion 46 as described above, parts of the second resin portion 46 and extra spots of the first resin portion 34 are ground as shown in FIG. 3(E) to expose the surfaces of the electrode posts 28. After the grinding, the second resin portion 46 formed at the grip portion 60 is left behind. Thereafter, as shown in FIG. 3(F), external connecting terminals 32 are placed on their corresponding exposed surface of electrode posts 28, and the external connecting terminals 32 are electrically connected to the electrode posts 28 by a reflow process step.

[Step for Dicing the Substrate at Each Central Part of the Second Resin Portion with Widths Each Being Narrower than the Trench thereby to Bring the Semiconductor Device into Fractionization and Division.

Figure 3G:
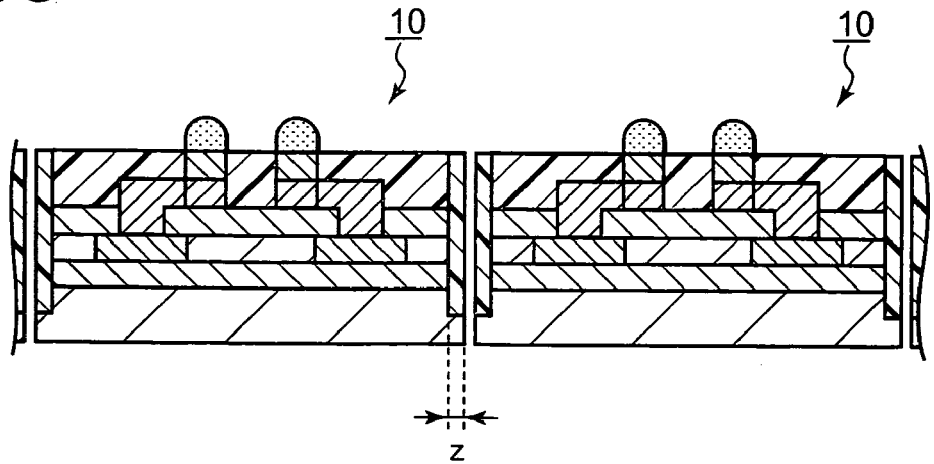
Figure 5A:
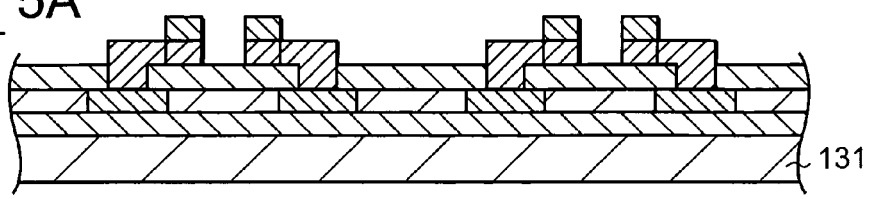
FIG. 5A-5E are process sectional views showing a conventional semiconductor device manufacturing method.
Figure 5B:
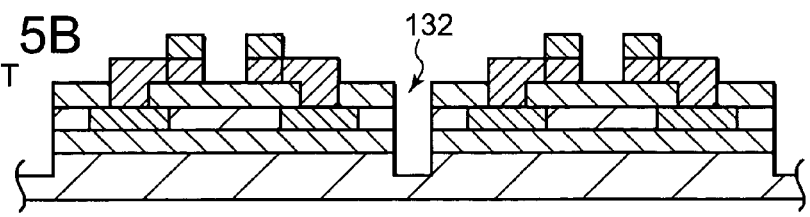
Figure 5C:
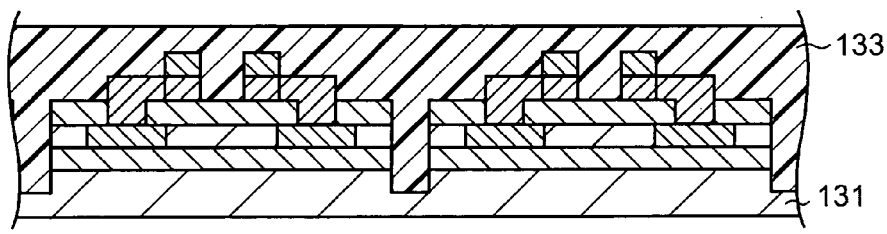
Figure 5D:
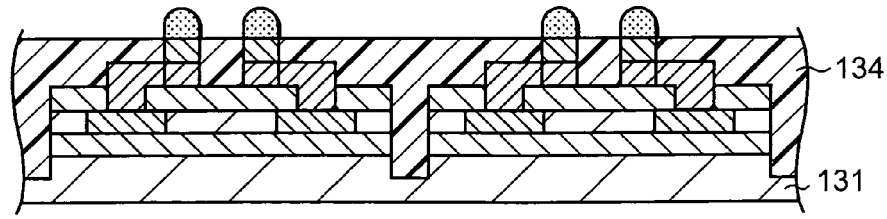
Figure 5E:
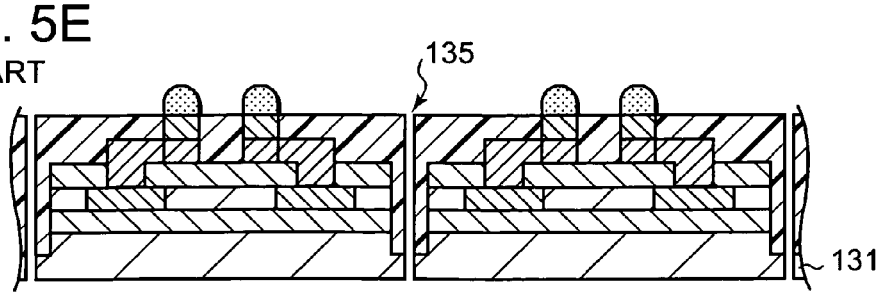

Finally, as shown in FIG. 3(G), the semiconductor devices can be obtained by conducting fractionizing and division from the respective center of the second resin portion 46 with a blade having a thickness narrower than the width of each trench 70. At this time, such one that the width z of the second resin portion 46 falls within the above range is selected as the blade thickness. The position where dicing is done in the corresponding process step, is preferably set to the central part of each second resin portion 46. The "central part" indicates such a position that each second resin portion 46 has at least the width z lying within the above range in each post-division semiconductor device. Even among such positions, such positions that the widths z of all semiconductor devices become identical are preferably diced in consideration of dimensional accuracy of each individual semiconductor device.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor device, comprising:
   a first area, and a second area positioned adjacent to an outside of the first area;
   a semiconductor substrate having a main surface and side surfaces and disposed in such a manner that the main surface is positioned in the first area and each of the side surfaces is positioned at a boundary between the first area and the second area;
   a plurality of pads formed over the main surface of the semiconductor substrate;
   an insulating film formed over the main surface of the semiconductor substrate with the pads being exposed therefrom;
   a plurality of external connecting terminals formed over the insulating film, which are respectively electrically connected to the pads;
   a first sealing resin portion formed over the main surface of the semiconductor substrate so as to cover the pads and the insulating film having a main surface and outermost side surfaces, said first sealing resin portion being formed in such a manner that the external connecting terminals are exposed from the main surface of the first sealing resin portion and each of the outermost side surfaces of the first sealing resin portion is positioned at the boundary; and
   a second sealing resin portion positioned in the second area and formed so as to cover the side surfaces of the semiconductor substrate and to completely cover the outermost side surfaces of the first sealing resin portion and the insulating film, said second sealing resin portion being different in composition from the first sealing resin portion.

2. The semiconductor device according to claim 1, wherein the semiconductor substrate has a first side surface and a second side surface located at the outside from the first side surface,
   wherein the first side surface corresponds to the side surface of the semiconductor substrate, and
   wherein the second side surface is positioned to an end at the outside, of the second area.

3. The semiconductor device according to claim 1, wherein the thickness of the second sealing resin portion is smaller than the sum of the thickness of the semiconductor substrate and the thickness of the first sealing resin portion and larger than the thickness of the first sealing resin portion.

4. The semiconductor device according to claim 1, wherein the external connecting terminals are respectively exposed from the main surface via redistribution wirings and columnar electrodes as viewed from the corresponding terminals lying over the semiconductor substrate.

5. The semiconductor device according to claim 1, wherein a first filler is contained in the first sealing resin portion,
   where a second filler is contained in the second sealing resin portion, and
   wherein the content of the second filler relative to the second sealing resin portion is lower than the content of the first filler relative to the first sealing resin portion.

6. The semiconductor device according to claims 1, wherein a first filler is contained in the first sealing resin portion,
   where a second filler is contained in the second sealing resin portion, and
   wherein the average particle diameter of the second filler is smaller than the average particle diameter of the first filler.

* * * * *